(12) United States Patent
Saastamoinen et al.

(10) Patent No.: US 11,462,674 B2
(45) Date of Patent: Oct. 4, 2022

(54) ADD-ON UNIT OR CABLE CONNECTABLE TO THE POWER SUPPLY OR SIGNAL CORD OF AN ELECTRIC DEVICE

(71) Applicant: Spindeco Technologies Oy, Kuopio (FI)

(72) Inventors: Pekka Tapani Saastamoinen, Kuusamo (FI); Petteri Koljonen, Kuopio (FI); Reijo Lappalainen, Hiltulanlahti (FI)

(73) Assignee: Spindeco Technologies Oy, Kuopio (FI)

( * ) Notice: Subject to any disclaimer, the term of this patent is extended or adjusted under 35 U.S.C. 154(b) by 474 days.

(21) Appl. No.: 16/621,268

(22) PCT Filed: Jun. 12, 2018

(86) PCT No.: PCT/FI2018/050440
§ 371 (c)(1),
(2) Date: Dec. 11, 2019

(87) PCT Pub. No.: WO2018/229331
PCT Pub. Date: Dec. 20, 2018

(65) Prior Publication Data
US 2020/0136012 A1 Apr. 30, 2020

(30) Foreign Application Priority Data
Jun. 14, 2017 (FI) .................... 20175553

(51) Int. Cl.
*H01L 41/107* (2006.01)
*H01L 41/31* (2013.01)
(Continued)

(52) U.S. Cl.
CPC .......... *H01L 41/107* (2013.01); *H01B 1/026* (2013.01); *H01B 1/04* (2013.01); *H01B 3/008* (2013.01);
(Continued)

(58) Field of Classification Search
CPC . H01L 41/107; H01L 41/0533; H01L 41/183; H01L 41/31; H01L 41/083;
(Continued)

(56) References Cited

U.S. PATENT DOCUMENTS 9,379,317 B2 6/2016 Bowen et al.
2006/0165983 A1 7/2006 Yoon
(Continued)

FOREIGN PATENT DOCUMENTS

CA 852387 A 9/1970
CN 205376145 U 7/2016
(Continued)

OTHER PUBLICATIONS

Finnish Patent and Registration Office, Search Report of Finnish patent application No. 20175553, dated Jan. 22, 2018, 2 pages.
(Continued)

*Primary Examiner* — David Vu
*Assistant Examiner* — Brandon C Fox
(74) *Attorney, Agent, or Firm* — Thomas | Horstemeyer, LLP

(57) ABSTRACT

The present invention discloses a method for creating spin-affected electric currents passively and feeding them into electric devices. The invention can be realized as either a rectangular black box incorporating coatings on top of and on the bottom of a conducting volume of material, or by coating a round-shaped wire or thread(s) of a cable. This is obtained by using a specific coating material on the conducting piece of material. The material may be piezoelectric, such as silicon dioxide (i.e. quartz) but also silicon carbide (SiC) may be used. Also, mixtures and composite arrangements are possible in order to create a coating. The manufactured add-on unit, when supplied with the input power or input signal, will act as an electron spin feeding device to the
(Continued)

electric device because the electrons will be moving strongly within the interface area of the coating and the conducting material with aligned spins. The resulting effect also lasts longer within the electric device than just the time when the add-on unit is connected to the electric device.

21 Claims, 12 Drawing Sheets

(51) Int. Cl.
  *H01L 41/053* (2006.01)
  *H01L 41/18* (2006.01)
  *H01B 1/02* (2006.01)
  *H01B 1/04* (2006.01)
  *H01B 3/00* (2006.01)

(52) U.S. Cl.
  CPC ........ *H01L 41/0533* (2013.01); *H01L 41/183* (2013.01); *H01L 41/31* (2013.01)

(58) Field of Classification Search
  CPC ......... H01L 41/087; H01B 1/026; H01B 1/04; H01B 3/008; H01F 1/0036
  USPC .......................................................... 257/29
  See application file for complete search history.

(56) References Cited

U.S. PATENT DOCUMENTS

| | | |
|---|---|---|
| 2011/0198118 A1 | 8/2011 | Fang et al. |
| 2014/0035712 A1 | 2/2014 | Thornkvist et al. |
| 2016/0087129 A1* | 3/2016 | Gibertini ............ G01R 33/1284 156/60 |

FOREIGN PATENT DOCUMENTS

| | | |
|---|---|---|
| CN | 106128442 A | 11/2016 |
| JP | H11306880 A | 11/1999 |
| WO | 2012020167 A1 | 2/2012 |

OTHER PUBLICATIONS

Murakami, Shuichi et al., Dissipationless Quantum Spin Current at Room Temperature, Science, Sep. 5, 2003, pp. 1348-1351, vol. 301.
Guo, Hong et al., Quantum spin field effect transistor, Physical Review B, Mar. 31, 2003, pp. 1-3, vol. 67 Issue 9.
Van 'T Erve, O.J.M. et al., Electrical injection and detection of spin-polarized carriers in silicon in a lateral transport geometry, Applied Physics Letters, Nov. 21, 2007, 4 pages, vol. 91 Issue 21.
Zhang, Xiuwen et al., Hidden spin polarization in inversion-symmetric bulk crystals, Nature Physics, Apr. 13, 2014, pp. 387-393, vol. 10.
Chen, Wei et al., Dissipationless Spin Current between Two Coupled Ferromagnets, Physical Review B, Mar. 2014, pp. 1-10, vol. 89 Issue 6.

* cited by examiner

Figure 11

| Time [min] | Pellet Crusher: [kW] Normal power cable | Pellet Crusher+SpinX: [kW] Normal+SpinX Cable |
|---|---|---|
| 0 | 0,68 | 0,5 |
| 1 | 0,65 | 0,5 |
| 2 | 0,55 | 0,51 |
| 3 | 0,64 | 0,5 |
| 4 | 0,66 | 0,52 |
| 5 | 0,66 | 0,54 |
| 6 | 0,63 | 0,52 |
| 7 | 0,61 | 0,53 |
| 8 | 0,55 | 0,51 |
| 9 | 0,6 | 0,5 |
| 10 | 0,66 | 0,52 |
| 11 | 0,64 | 0,52 |
| 12 | 0,62 | 0,52 |
| 13 | 0,62 | 0,53 |
| 14 | 0,65 | 0,53 |
| 15 | 0,64 | 0,52 |
| 16 | 0,61 | 0,51 |
| 17 | 0,62 | 0,52 |
| Average | 0,63833 | 0,5167 |
| Difference [%] | | -19,06 % |

ID OF THE POWER SUPPLY OR SIGNAL CORD
OF AN ELECTRIC DEVICE

ADD-ON UNIT OR CABLE CONNECTABLE TO THE POWER SUPPLY OR SIGNAL CORD OF AN ELECTRIC DEVICE

PRIORITY

This application is a U.S. national application of the international application number PCT/FI2018/050440 filed on Jun. 12, 2018, which claims priority of Finnish application FI20175553 filed on Jun. 14, 2017, the contents of all of which are incorporated herein by reference.

FIELD OF THE INVENTION

The present invention relates to electrical engineering and ways to change electrical properties and characteristics of various electrical devices. It can be also said that the present invention relates to magnetoelectronics and spintronics, generally.

BACKGROUND OF THE INVENTION

English mathematician Oliver Heaviside performed calculations already in the end of the 19th century where the signal transfer properties were optimized in long electric conductors and cables. He proposed an addition of induction coils with the telephone cables and this results in increased self-induction and reduction of the signal distortion. Based on Heaviside's results, physicist M. I. Pupin developed so-called "pupinization technique" for the telephone traffic which was still used in the 1970's. Separate Pupin's loading coils are added in both ends of the transfer line. This way the inductance is increased in the transfer line and it has many advantages: signal attenuation is decreased, propagation time delays are shortened (thus, increasing the intelligibleness of the speech), and the crosstalk between the transfer lines is mitigated as well. Pupinization coils can be placed along the cable with uniform spacings as well. In practice, the pupinization coil is formed by a double winded coil with a toroid-shaped base. The Pupin's invention approximately doubled the available length of the used telephone cables, in practice.

In quantum mechanics, "spin" means a characteristic feature of elementary particles, analogously corresponding to the angular momentum in classical mechanics. Spin is a quantized quantity in the sense that the quantum number "s" representing the spin may be either an integer or a half-integer. More precisely, the spin of fermions (such as electrons, protons and neutrons) is a half-integer and the spin of bosons (such as photons) is an integer. For example, the spin of electrons may exist in two different states; it is either $-\frac{1}{2}$ or $+\frac{1}{2}$. Bosons are elementary particles following the Bose-Einstein statistics, and fermions, in turn, follow the FermiDirac statistics and also the Pauli exclusion principle. In simple terms, the spin can be considered as meaning the rotary movement of elementary particles about a specific axis of rotation.

Spintronics means technologies generally utilizing the spin of electrons as well as the electric charge in their processing, this way making possible to control the electrons, i.e. to control the electric currents, in a desired manner. Spin polarization, in turn, means manipulation of the electron current so as to align the spins of the electrons. This way, in simplified terms, a set of electrons rotating about the same axis is provided, one analogy of which is coherent laser light. If the electric current is formed by the movement of electrons manipulated in this manner, it could be stated that the current is so-called spin current. Such a current propagates practically free of losses nearly at the speed of light, in distinction to the traditional current formed by charge carriers.

Most generally, spintronics is utilized with the so-called thin film techniques. One example of such a thin film technique utilizing the spin effect of electrons is the so-called GMR ("Giant magnetoresistance"). It is based on alternating the layers of ferromagnetic metals magnetized in different directions and non-ferromagnetic metals. The effect utilizes the spin characteristic of electrons on the basis of the fact that the electrons with a spin that is aligned with the magnetic field of a magnetic conductor scatter differently than the electrons having an opposite spin. It depends on the conductor, which type of the electrons scatter more. At the simplest, the GMR effect can be constructed with three material layers having two ferromagnetic layers magnetized in opposite directions and a non-ferromagnetic layer between them. In this case, the electrons provided with a specific spin scatter in the first layer and the electrons provided with a specific second spin scatter further in the third layer. From this it follows that the resistance of the structure becomes very strong. The GMR technique is utilized e.g. in hard disk readers of the computer.

Publication "Murakami, Nagaosa, Zhang: Dissipationless Quantum Spin Current at Room Temperature, Science, Vol. 301, published on 7 Aug. 2003" (later: "Murakami"), describes the spin-current effect at room temperature. Murakami discusses theoretically the development of spin current at room temperature and in specific semi-conductors such as silicon, germanium and gallium arsenide.

The so-called Spin Hall effect means accumulation of electrons moving in a semi-conductor on different sides of the semi-conductor sample in such a way that the spins of opposite signs accumulate on different edges of the semi-conductor a bit like in the classical Hall effect. This effect can develop without an external magnetic field. On the other hand, an already generated Spin Hall effect can be eliminated by a strong external magnetic field. In addition to semi-conductors, the effect has lately been also observed with metals.

In the prior art, spin currents have also been generated by using a rotary magnetic field that can be generated without a developing current formed by charge carriers. The spin current can be generated by using a separate voltage in this situation. This way, for example a so-called spin field effect transistor can be generated, see publication Guo et al.: "Quantum spin field effect transistor", Phys. Rev. B 67, 092408, published 31 Mar. 2003.

One way of generating strong spin currents in silicon is presented in publication "Electrical injection and detection of spin-polarized carriers in silicon in a lateral transport geometry", Applied Physics Letter, Vol. 91, issue 21, November 2007. In the publication, silicon is provided with contacts for feed and detection, which are magnetized with magnetic fields perpendicular to each other. As a final result, a channel containing purely spin current instead of charge current is formed in silicon.

Publication WO 2012/020167 ("Spindeco 1") discloses a way to enable creation of a spin-current by manufacturing a thin carbon coating onto a metallic electric conductor material, such as a copper wire. The thickness of carbon layer can be 10 nm . . . 100 μm. The carbon layer may comprise graphene or a carbon nanotube structure.

US patent publication U.S. Pat. No. 9,379,317 ("Bowen") discloses a spin-polarized current source or in other words, "a spin injection device". Bowen injects polarized spins into an organic layer, and in practice, a current source is connected to a polarized spin injection device capable of filtering electrons from the current source depending on their spin. An example of the used organic material is phthalocyanine ($=C_{32}H_{18}N_8$). One possible structure comprises two substrates, two organic layers, and an intermediate layer between the organic layers. Bowen specifies the operation of the device to occur in temperatures higher than −220° C. The first face of the substrate may comprise cobalt, nickel, iron, an iron or cobalt alloy with 4d and/or 5d type metals or at least one magnetic oxide. The organic layer may comprise carbon or phenanthroline. The space between the second face of the organic layer and the ground in FIG. 2 may comprise further organic material.

"Xiuwen Zhang, Qihang Liu, Jun-Wei Luo, Arthur J. Freeman & Alex Zunger, Hidden spin polarization in inversion-symmetric bulk crystals, Nature Physics 10 (2014) 387-393. doi:10.1038/nphys2933" (Zhang) discloses spin polarization in non-magnetic 3D crystals. Zhang states that the spin-polarization effect originate from specific atomic site asymmetries. It states that spin polarization should exist in materials which have centrosymmetric crystals.

"Dissipationless spin current between two coupled ferromagnets, Wei Chen, Peter Horsch, and Dirk Manske, Phys. Rev. B 89 (2014) 1-10" (Chen) discloses that a spin current will flow in a dissipationless fashion between two coupled ferromagnets if their magnetic orders are misaligned. A uniform and static magnetic field is one way of creating the misaligned configuration. Both metallic and insulating ferromagnetic materials are possible in obtaining this effect according to Chen.

The main problem of the prior art in generating spin currents is that they require an external manner or source to produce the spin current. Typically, these include different spin pump arrangements (which can be considered, in a broad sense, as a counterpart for an accumulator in spintronics) and for example the use of external magnetic and/or electric fields in controlling the spins.

SUMMARY OF THE INVENTION

The present invention introduces an add-on unit which is connectable to a power supply cord or to a signal cord of an electric device. It is characterized in that the add-on unit comprises:
  an electrically conductive material; and
  a coating on at least one surface of the electrically conductive material or on a part of that surface, where the coating comprises material which has a non-centrosymmetric crystal structure resulting in a creation of polarizing effect within at least one of the electrically conductive material and the coating when affected to an electric field occurring when the add-on unit is connected to the power supply cord or to the signal cord of the electric device.

In an embodiment of the invention, when the add-on unit is connected electrically between an electric power supply or a signal supply cord, and the electric device, the add-on unit acts as a spin source unit feeding spin-polarized current to the electric device.

In an embodiment of the invention, the add-on unit is connected in parallel with a power supply cord or a signal supply cord of the electric device.

In an embodiment of the invention, the add-on unit is connected in a shunt connection in a power or signal input of the electric device.

In an embodiment of the invention, the coating comprises material with piezoelectric characteristics.

In an embodiment of the invention, the material with piezoelectric characteristics is silicon carbide or silicon dioxide.

In an embodiment of the invention, the coating comprises material which is configured to experience a poling effect when affected to an electric field.

In an embodiment of the invention, the coating comprises ferroelectric or pyroelectric material.

In an embodiment of the invention, the electrically conductive material is manufactured from at least one of the following materials: copper, aluminium, carbon, iron, nickel, metal alloys, at least partly semiconducting material such as silicon, graphite, graphene or some other allotropic form of carbon.

In an embodiment of the invention, the coating is made of PZT, $BiFeO_3$, $BaTiO_3$, Rochelle salt, zinc oxide, zinc sulfide, aluminium nitride, bismuth germanate, or of a desired combination of at least two of these substances.

In an embodiment of the invention, the coating is manufactured from a mixture of a piezoelectric material and a diamagnetic material.

In an embodiment of the invention, the coating is manufactured as a composite coating with at least two different layers.

In an embodiment of the invention, the coating is manufactured as a mixture comprising at least two different substances which are mixed to form a homogenous coating.

In an embodiment of the invention, the coating is further coated with an insulating layer.

In an embodiment of the invention, two add-on units are integrated together via an insulating region in an AC application.

In an embodiment of the invention, the add-on unit has a form of a rectangular parallelepiped with the input and output cords connected in opposite ends of a longitudinally shaped add-on unit.

In an embodiment of the invention, the add-on unit has a form of a coated wire or it is formed as a group of coated threads forming a cable.

In an embodiment of the invention, the thickness D of the coating is selected between 10 nm<D<0.5 mm.

In an embodiment of the invention, the length L of the coated conductive material is selected between 0.5 m<L<2 m.

In an embodiment of the invention, the coating is a composite layer structure or a mixture of at least two substances where a polymer acts as a binder and at least one piezoelectric material act as an active ingredient, wherein the mass of the polymer is selected between 10-60% from the total mass of the coating and the mass of the at least one piezoelectric material is selected between 40-90%, respectively.

In an embodiment of the invention, the add-on unit comprises a stacked group of several coated sheets, disks or coils where insulating layers are placed between different active layers.

In an embodiment of the invention, the coating is configured to be manufactured by Chemical Vapour Deposition (CVD), Physical Vapour Deposition (PVD), Pulsed Laser Deposition (PLD); or by depositing the material by spraying, spreading with a brush or dipping in a paste, and drying or heat treating the deposited material in a separate process stage.

According to a second aspect of the present invention, a method of creating and feeding spin-polarized electric current to an electric device by an add-on unit is introduced. The method is characterized in that the method comprises the steps of:

manufacturing an add-on unit by coating an electrically conductive material with a coating concerning at least a part of a surface of the electrically conductive material, where the coating comprises material which has a non-centrosymmetric crystal structure resulting in a creation of polarizing effect within at least one of the electrically conductive material and the coating when affected to an electric field occurring when the add-on unit is connected to the power supply cord or to the signal cord of the electric device; and connecting the add-on unit electrically to a signal input cord or to a power supply cord of the electric device in order to create and feed spin-polarized electric current to the electric device.

BRIEF DESCRIPTION OF THE DRAWINGS

FIG. 11 illustrates measurement results for channel resistances of various field-effect transistors (FETs)

DETAILED DESCRIPTION OF THE INVENTION

Figure 1:
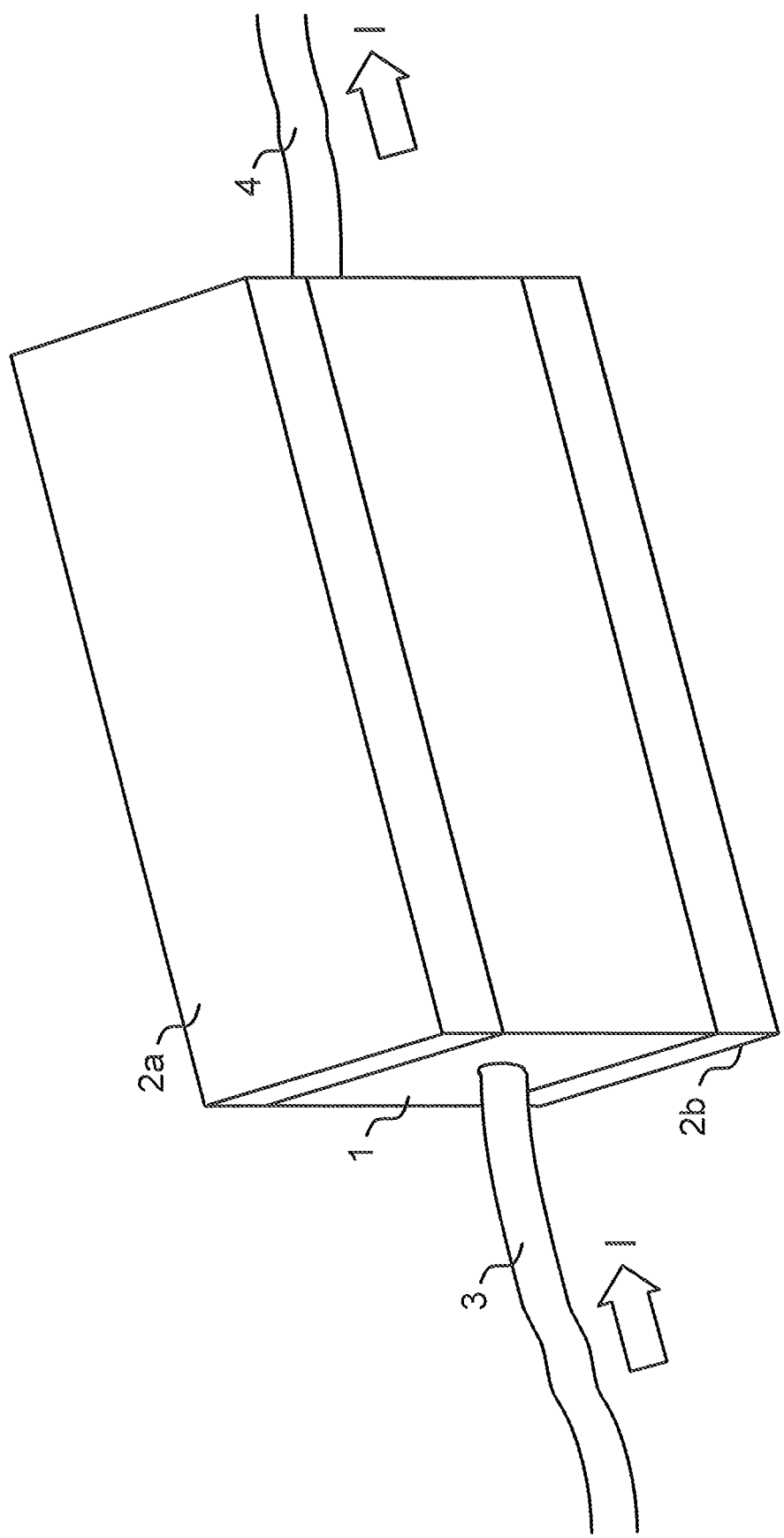
FIG. 1 illustrates a first embodiment of the invention, where the added object is in a form of rectangular parallelepiped, coated with a substance in two sides of the object.

The present invention introduces a method and arrangement where a significant polarization of the charge current electrons is created and maintained within a conductive material. This goal is obtained with using specific materials which are used as coating materials to the conductive material. This results in coherent state of the electrons as a surface phenomenon within the materials. A further object in the present invention is to inject such a coherent spin state of the electrons to electrical conducting wires and even to distinct electrical devices which have a galvanic connection to the spin injecting device. In a sense, the inventive idea can be broadly described as "a black box" which creates and injects spin to a wire, which is able to further propagate further away to distant electrical devices. The idea of a black box comprises also a coated wire or a group of coated metal threads forming together a cable. The idea of a black box comprises also a concept of coated sheets, coated disks or coated coils. Furthermore, the invention may be realized in a similar manner as a capacitor with a stacked, planar disk structure. This means that coated disks or films can be stacked on top of one another where insulating layers are placed between these active layers. The size of a single layer (disk) can be freely selected but in one possible embodiment it can be 3 cm*8 cm. In one embodiment, a layered structure according to the invention may also be in a rolled configuration, such as a rolled capacitor.

The black box of this invention can also be called as an add-on unit which is also used in the context of the claims.

In more specific technical terms, the origin in the present invention and during its research process has been using an applied electric field across an examined material, which results in a polarizing effect within the examined material. Many ferroelectric and pyroelectric materials have this kind of characteristic but many other substances also act in this way with an externally applied electric field. In the present invention, the electric current propagating in the conductive material itself acts as means for creating an electric field and for the surrounding material such as the coating, it acts as an "external" electric field. In other words, no other external source for the electric field is required. As a result, in other words, a magnetic moment is achieved in a specifically characterized material where an atom in the middle of the lattice structure locates in an offset position (i.e. forming a non-centrosymmetric crystal structure). This results in the fact that the polarizing effect is possible.

One example of the materials where the lattice structure fulfils the above criterion is formed by materials with piezoelectric properties. The piezoelectric properties are strongly associated with the above non-centrosymmetric crystal structures of materials. A further specific example of a material having piezoelectric properties is silicon carbide (SiC). When using a material which incorporates piezoelectric properties at least in some environmental conditions (such in a specific temperature range), such material (when coated on another material) will create a polarizing effect. This fact directly leads to creation of so-called spin current with special electrical properties. These special electrical properties are main advantages of the invention and they are discussed in detail later.

The spin polarization of the electrons is obtained without any external power supply or power device. The spin polarization will be created in a two-dimensional "passageway" which is obtained in an interface between two materials by an electric field where an electric current passing through the conducting material creates this electric field.

The conductive material is in the context of the application a metal, a semiconducting material or another kind of a material, or a combination or mixture of these materials, which enables the movement of the charge carriers.

One significant advantage of the invention is that the properties of the electric devices can be enhanced by merely adding a single operational device to any old or new electric devices, without any need for further modifications or parameter settings. This is obtained by picking the electric supply current which would otherwise be directed straight into the electric device, into a spin injection device. This device manipulates at least part of the charge carriers, and in this way, polarizes their spin. Such manipulated electric current is fed to the electric device, and the effect of the invention will be transferred to the electric device without any other further modifications. This is a revolutionary achievement.

One advantage of the use of the add-on unit according to the invention is that it carries an effect into the future as well. This means that when the black box is connected to an electric device, it creates the discussed effects in the electric device either almost instantly or after a short time period. After that, when the black box is removed from the connection, the effect stays in the "memory" of the electric device even for a long period of time. This is a significant advantage of the invention. The phenomenon is slightly similar like in polarization in general or in magnetization where the effect stays longer after the initiation of the created effect, and it will fade slowly in a function of time even after the source for the effect has been removed from the system.

Other advantages are numerous and substantial, and they comprise increasing of the energy performance, increasing the efficiency, enabling lowering of the operational temperature, increasing the operation lifetime of the device, and linearization of the electronic functions in general. In various digital devices, the rising and falling speeds of pulses can be increased. All these advantages can be obtained, no matter if the electric device has a high or low operational voltage, or if the device uses AC or DC current, according to the tested examples referred in this disclosure. This makes the present invention highly universal in its usability.

FIG. 1 illustrates a first embodiment for creating the spin effect according to the invention. In this example, the physical object which creates the spin effect is called as a spin source. The spin source comprises a rectangular parallelepiped shaped piece of electrically conducting material 1. The conducting material 1 can be any electrically conductive material which is used in electric current wires, such as copper or aluminium, for instance. The rectangular parallelepiped piece of conducting material 1 is coated both from the upper side and the lower side of the piece by a coating material 2a, 2b. In this embodiment, the coating material has an uniform thickness across the whole top and bottom surface of the conducting material 1.

In an alternative embodiment, it is possible to coat e.g. four side surfaces of a rectangular parallelepiped piece of conducting material 1. It is possible to coat all surfaces of a rectangular parallelepiped piece of conducting material 1. Furthermore, the invention can be realized by having a hollow and tubular piece of conducting material where the coating can be applied to either the inside surface or to outside surface of the tube, or even both these surfaces of the tube. The tubular structure may even have different cross-section profiles than just round ones; also e.g. squared, rectangular, or some other special profile can be applied.

The structure of a coated conductive material (such as e.g. the one of FIG. 1) can be "multiplied" by having a stacked group of several coated sheets, disks or coils where insulating layers are required between different active layers. The insulating material can be e.g. air or a dielectric material. This kind of structure creates a group of parallel signal or power lines for the electric power.

In order to achieve the spin creation effect of the present invention, the coating material 2a, 2b is selected to be a piezoelectric substance such as SiC (silicon carbide) or $SiO_2$ (silicon dioxide, i.e. quartz), or a selected mixture or composite of at least two of these substances. In addition to an active piezoelectric substance, the coating material 2a, 2b may contain an additional component such as polymer resin as a binder, or air in a porously formed coating material 2a, 2b. The binder material and the active piezoelectric substance (or the one with the same active effect) can be mixed in order to obtain a homogenous mixture within the coating material 2a, 2b. With piezoelectric substance, any material having piezoelectric characteristics at least in some environmental situation or in a given temperature range or value is meant in this regard. In an embodiment, the coating material is selected to be a poling material, i.e. a material which polarizes when placed in an electric field. In an embodiment, the coating material is selected to be a ferroelectric material or a pyroelectric material.

In a core embodiment of the invention, the coating material is selected to comprise material whose crystal structure is non-centrosymmetric. Such a material is able to spontaneously polarize when effected in an electric field.

In an embodiment, a mixture of at least two substances is selected to be a homogenous mixture. In another embodiment, the composite structure is made from at least two layers with at least two different substances so that a single layer is manufactured from a single substance. In a yet further embodiment, it is possible to use a different substance, combination or mixture ratios of the substances in the bottom side coating 2b than in the top side coating 2a. The current supply wire feeds the electric current by an incoming wire 3 into the spin source (i.e. into the add-on unit 8). Correspondingly, the outgoing current from the spin source is fed through the outgoing wire 4. In the context of the present invention, the current in wire 3 is non-manipulated, while the outgoing current in wire 4 is manipulated by the spin source. In an embodiment of the invention, the incoming current wire 3 and the outgoing current wire 4 are both the same, regular electrical current wires. In a typical arrangement, the incoming current wire 3 is plugged to the power supply socket, and the outgoing current wire 4 is connected to an electrical device (not yet shown).

Figure 2:
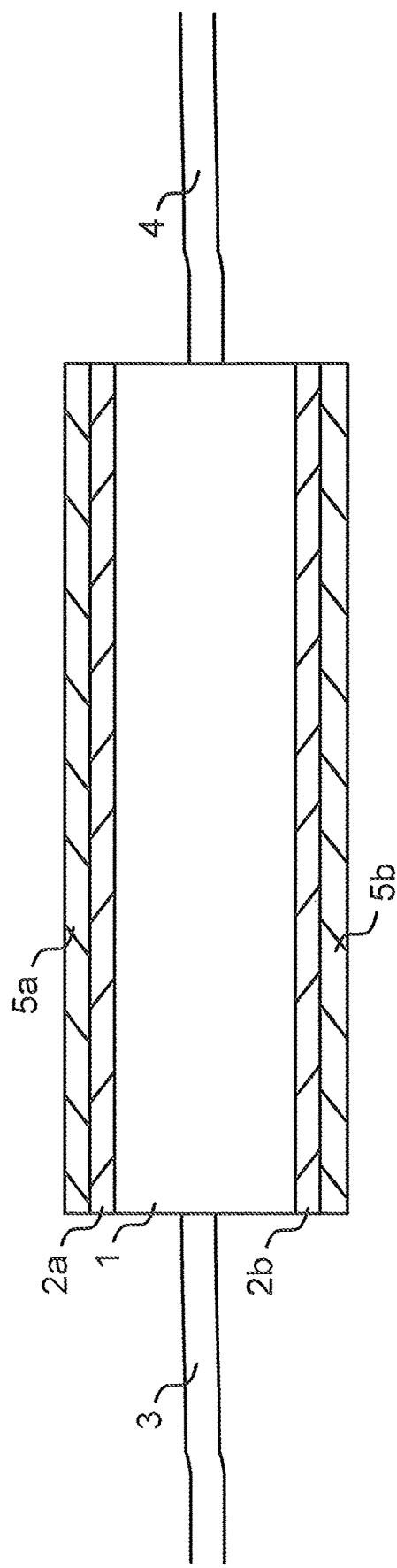
FIG. 2 illustrates a cross-section of another embodiment of the invention, where an insulation layer is added on both sides on top of the coating.

FIG. 2 illustrates a vertical cross-section of another embodiment according to the invention. The illustrated cross-section slices a spin source into a halved one, and this illustration reveals different layers of the arrangement. Many parts of the arrangement are the same or with a same functional approach as in FIG. 1. The incoming electric current wire 3, the electrically conducting material 1, the outgoing current wire 4, and the upper coating material 2a and the lower coating material 2b are the same parts as in FIG. 1. In addition to this structure, and different available substances and their possible mixtures, the arrangement is further completed by an insulation layer both on top of the upper coating material 2a and below the lower coating material 2b. These insulation layers are layers 5a and 5b, correspondingly. The material of an insulating layer 5a, 5b can be selected from any available material acting as an electric insulator, depending in the used application and electric parameters, such as used voltages. The thickness of the insulation layers is selected based on the applied voltage and regulations governing electric safety standards. The role of the insulation layers 5a, 5b is to prevent electric breakdown and short-circuiting through the layered structure. In one embodiment, the insulation layer is also present between a connecting end of the electric current wire 3, 4 (in view of the spin source) and the left or right end of the horizontal insulation layer, i.e. along the vertically aligned end surface of the spin source. This means that also the left hand side surface of the spin source and the right hand side surface of the spin source can be protected and shielded by an "extended" insulation layer.

Figure 3:
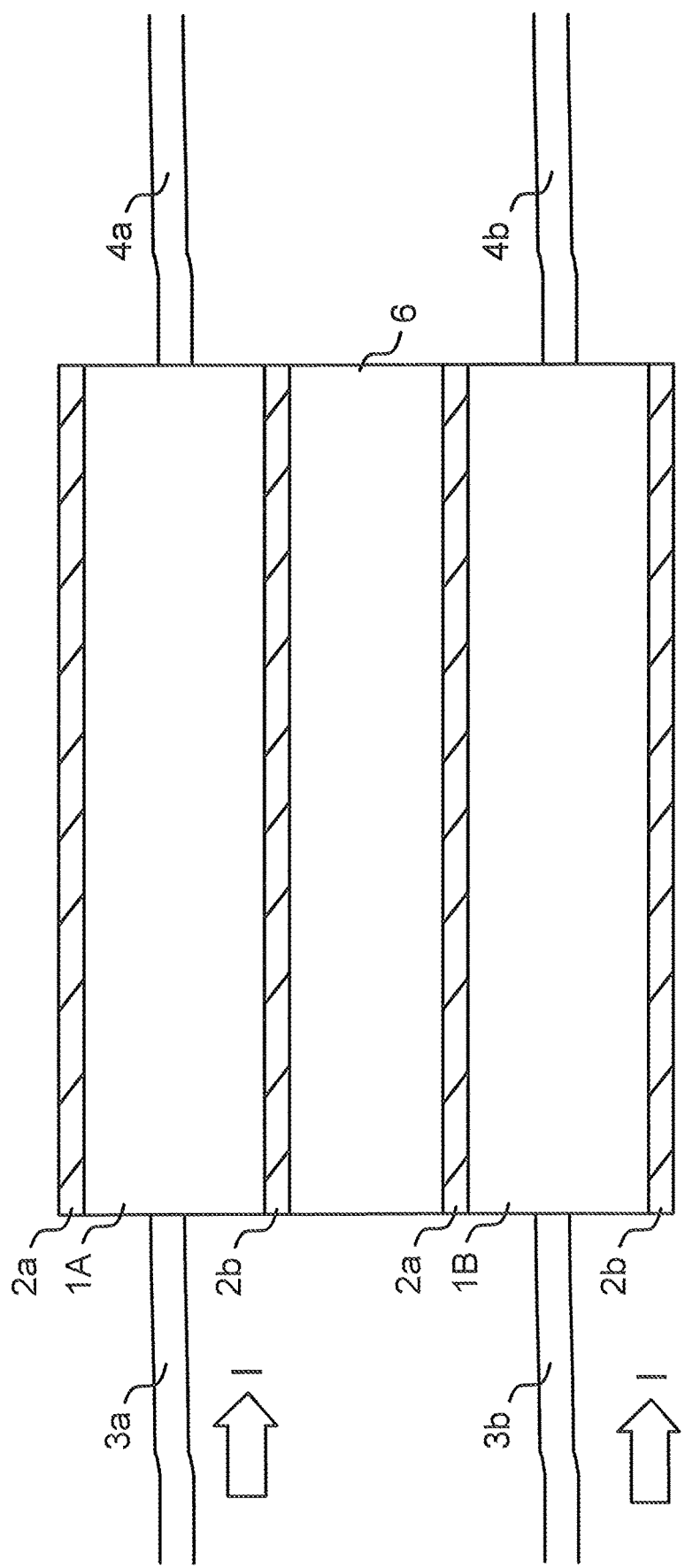
FIG. 3 illustrates an added object in yet further embodiment, where two electric wires are affected with a single added object.

FIG. 3 illustrates a yet another embodiment disclosing a situation applying alternating current (AC) where a hot wire and a neutral wire are shown (without the ground wire). These two wires are integrated within a single structure applying one modified unit of a spin source. In this arrangement, the upper part of the figure shows a hot wire with an electric current 3a feeding into a first piece of an electrically conductive material 1A. On the upper surface of the first piece there is a first upper coating material 2a, and on the lower surface of the first piece there is a first lower coating material 2b. The electric current affected by the spin source is then fed out of the arrangement through electric wire 4a. The direction of the operation is emphasized by the electric current "I" marked as flowing from the left hand side to the right.

Correspondingly, an electric current of a neutral wire is flown through a lower part of the same arrangement. This is represented by an input electric wire 3b feeding the "unaffected" electric current to a lower spin source unit. This unit is represented as a second piece of an electrically conductive material 1B, and a second upper coating material 2a and a second lower coating material 2b, correspondingly with the upper section of the arrangement. The "spin-affected" electric current is fed out of the arrangement through electric wire 4b, illustrated by electric current "I" going from right to left. Clarifying the role of the AC current in this kind of arrangement, the electrons run back and forth in both electric wires, as in normal AC current wire, but the electric power is fed from left to right, meaning that a suitable machine, such as an electric motor, can be connected to wires 4a, 4b.

Between the two spin-affecting volumes represented by the materials 1A, 1B and their respective coatings, there is a further insulating region 6 between the first lower coating material and the second upper coating material. The insulating region 6 thickness and material can be selected based on applied electric parameters and regulations governing electric safety standards. In one embodiment, the material of the insulating region 6 can be the same as material 5a and 5b of FIG. 2 but this is not necessary. In other words, the insulating region 6 material can be selected freely among available insulating materials.

In the AC example shown in FIG. 3, the spin effect created in the disclosed structure will "propagate" along both wires 4a, 4b into an electric device connected in these wires. The effects themselves are discussed in detail later.

Figure 4:
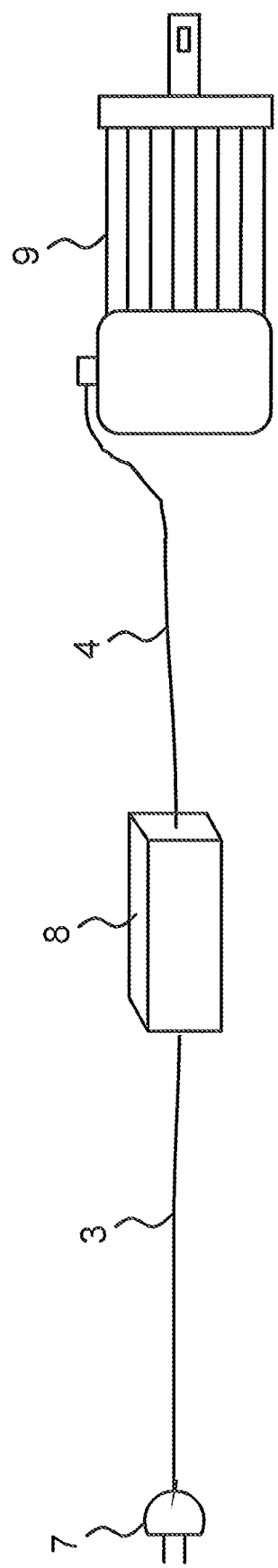
FIG. 4 illustrates an embodiment of an arrangement of a use situation where the added object is connected with an electric device.

FIG. 4 illustrates an example of a practical system and usage of the spin source unit. In this example, the electrical device is selected to be a regular electric motor 9. The set-up for creating the effect according to the present invention is a simple one. It is enabled by adding "a black box 8" between the electric current supply and the actual electric device 9. The connection is shown through the electric supply plug 7, the input electric wire 3, the spin source unit 8 as the black box itself and the output electric wire 4 feeding the affected current to the electric motor 9. As it can be seen from the figure, the black box 8 does not replace any existing power cabling but it is added to the existing system. The effect of the invention is that the spin-affected current is able to propagate along the output electric wire 4 or along several connected wires for a distant target. The distant target is in this case the electric motor 9. The distant target can be any selected electrically operating device, such as a HiFi device, a high-voltage device or system, a motor, a generator, any household appliance or entertainment device, a charging device or any device using 1-phase AC, 3-phase AC or a DC electric power, and also common power connection cables in general.

When discussing the magnitude of the created effect as a function of the cable length between the add-on unit and the electric device, the effect generally weakens as a function of distance in meters from the add-on unit. However, in general, this is not a hindrance in usually applied cable lengths used in power cables and signal cords.

Figure 5:
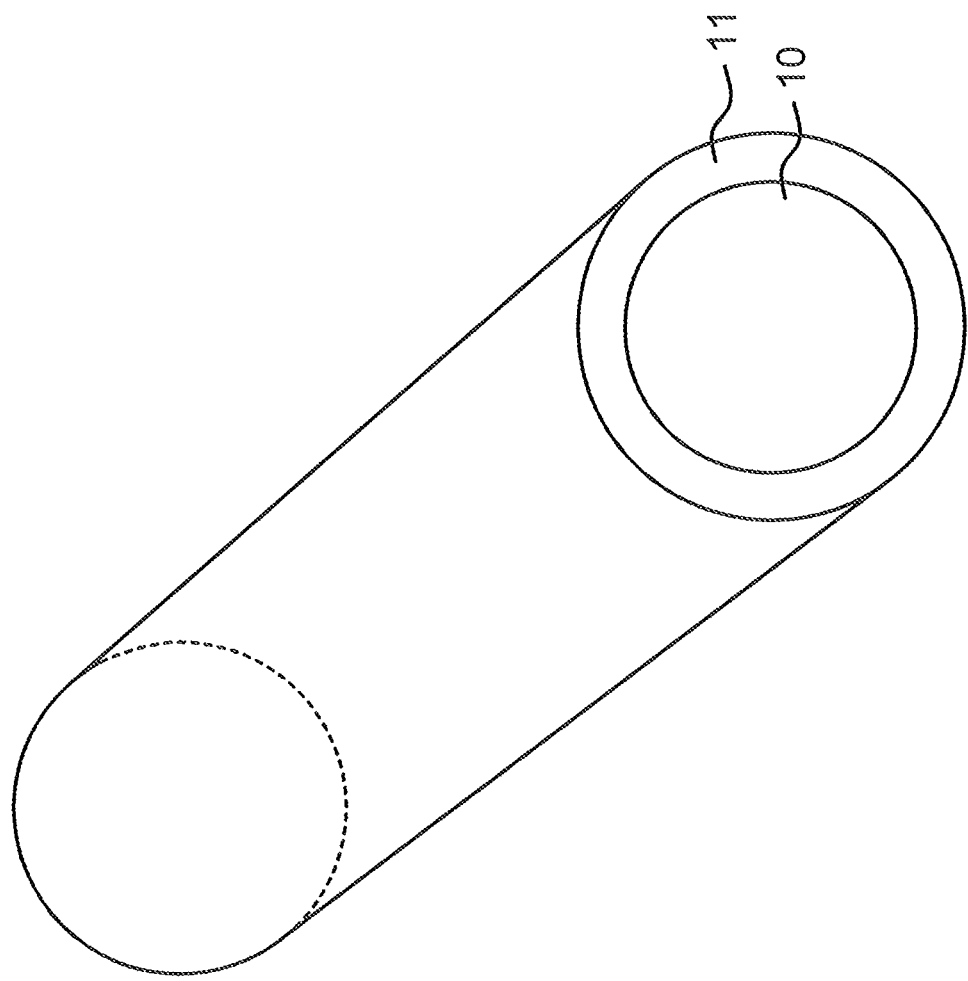
FIG. 5 illustrates an embodiment, where a wire with circular cross-section is coated with a substance.

FIG. 5 illustrates another type of arrangement for creating spin-affected electric current. This embodiment is created by taking the black box (i.e. the spin source according to FIGS. 1-4) away from the arrangement and converting the elements 3, 4, and 8 with a coated cable according to FIG. 5. The cable comprises an electrically conductive wire 10 which is uniformly coated with a coating material 11. The cross-section of the electrically conductive wire 10 is round in this example, as in common electric wirings. In this embodiment, the same spin-propagating effect, as performed with a black box of FIGS. 1-4, is created in the interface between the wire 10 and the coating 11. The wire 10 corresponds to element 1 while the coating 11 corresponds to elements 2a and 2b as combined together.

The embodiments discussed in FIGS. 1-5 generally disclose single wires which have been coated according to the invention. The invention can be generalized into commonly used cable designs such as to bundled wires or threads, coaxial cables, pair shielded cables, multi-strand wire cables, which typically have different combinations of wires, insulating layers or films and/or conductive foils. In other words, any kinds of cables can be manufactured with the same manufacturing machinery as before with just a difference that the coated wire or a coated planar surface is applied instead of a raw wire or a raw planar surface. The effect obtained with the invention can be observed in all types of cables.

Figure 6:
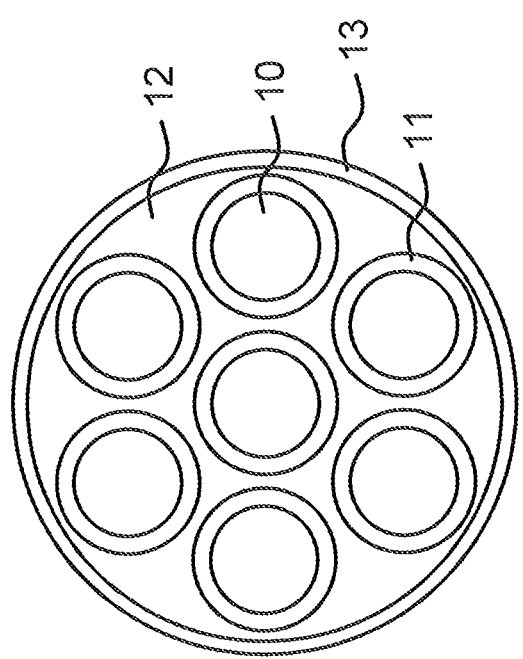
FIG. 6 illustrates an arrangement where a wire bundle is created from the wires which are coated with a substance according to the invention.

As yet another embodiment of the invention represented as a bundle of round wires intertwined with one another, FIG. 6 is referred to. In this example there are seven wires 10 which each have a coating 11. These coated wires are bundled together. The bundled wires can then be surrounded by an outer jacket 13 which is manufactured from an insulating material. Furthermore, the inner gaps between the coated wires can be filled with a further insulating material 12. Another option is to let the gaps be filled with air. In case the coated wires 10, 11 are each applied with an own insulating layer such as in FIG. 2, the gaps 12 may comprise merely air as the insulating material. The outer jacket 13 then protects the bundled wires from the outside world and the possible moist and other interfering materials.

In an embodiment of the invention, in the spin source, its conducting material 1 is manufactured from at least one of the following materials: copper, aluminium, carbon, iron, nickel, metal alloys, at least partly semiconducting material such as silicon, graphite, graphene or some other allotropic form of carbon.

In an embodiment of the invention, in the spin source, the coating material 2a, 2b is manufactured from at least one of the following materials: any material which has poling properties when affected in an electric field, or any material with piezoelectric characteristics in at least some temperature value(s) or range. Specific examples of materials are SiC, $SiO_2$, PZT, $BiFeO_3$, $BaTiO_3$, and Rochelle salt (=Potassium sodium tartrate tetrahydrate), zinc oxide, zinc sulfide, aluminium nitride, bismuth germanate, or a desired combination of at least two of these substances.

In an embodiment, the coating material 2a, 2b is manufactured from a mixture of a piezoelectric material and a magnetic material. As a specific example, the mixture can be formed from a piezoelectric material and a diamagnetic material. A further binding material can be applied to the mixture as well.

In an embodiment of the invention, the selected piezoelectric material is silicon dioxide.

In an embodiment of the invention, the effect of the invention is achieved with coated wire or cable lengths of 0.5-2 meters (meaning an effective length of the coated conductive material). Still, also some other lengths can be feasible. This also depends on whether the used cable is a single-wire structure or a multi-wire structure or even implemented with a more complex cabling design.

In an embodiment of the invention, the thickness of the coating is selected between 10 nm<D<0.5 mm.

In an embodiment of the invention, the coating layer is manufactured on top of a surface of a conducting material by several possible manufacturing methods, such as Chemical Vapour Deposition (CVD), Physical Vapour Deposition (PVD), Pulsed Laser Deposition with short or ultrashort laser pulses (PLD/US-PLD); or by depositing the material in some way, such as by spraying, spreading with a brush or dipping in a paste, and drying or heat treating the deposited material in a separate process stage.

In an embodiment of the invention, the deposited coating is a composite layer structure where a polymer acts as a carrier matrix (binder) and piezoelectric materials such as SiC act as an active ingredient. The amount of polymer may be 10-60% (mass percentage of the total coating) and the amount of piezoelectric material may be 40-90%, respectively.

In an embodiment of the invention, the coating is implemented in a form of a pulverized substance, i.e. the conductive material can be submerged in a pulverized material, which enables the effect according to the invention. The pulverized material may be placed in a box where the conductive material is placed as well. These structures can be obtained also with planar conductive disks where pulverized substance is placed e.g. on top of the disk, or between two conductive disks (and possibly with a surrounding jacket or other covering structure). Also it is possible to fill the gap between a conductive wire and its insulating jacket with a pulverized substance to obtain a conducting wire with a pulverized coating.

In an embodiment, the spin source is connected in parallel with the electric device, instead of the serial configuration shown in FIG. 4. In this arrangement, the add-on unit locates in parallel with the relevant signal cable of an electric device. In other words, the add-on unit is added to the present system, and it will not replace any existing cabling in the electric device power input. Other optional connection arrangements comprise a shunt connection where the add-on unit (like a cable) may locate transversely between two circuit lines, possibly accompanied with an additional electric component such as a coil or capacitor in series with the add-on unit.

We next discuss different practical examples of different structures which are able to show the effect of the spin source. Referring back to a general structure of FIG. 1, the conducting material 1 is coated in the first example with a piezoelectric material from both the bottom surface and the top surface of the conducting material 1. The thickness of the coating layer 2a is notable less than the thickness of the conducting material 1. When an electric current is fed to the spin source 1, 2a, 2b, in its longitudinal direction, the moving carriers will create an electric field and also a magnetic field. The coating material, which is dielectric, will enhance the created electric field. The resulting electric field will polarize the dipoles of the piezoelectric material so that these dipoles have a mutual polarization angle. The mutual polarization angle can be aligned in the same direction as the created electric field, but the polarization angle can also be in orthogonal direction to the created electric field. This polarization angle depends on the selected piezoelectric material. Regardless of the actual polarization angle, this physical phenomenon results in a situation where the coating material obtains a so-called coherent spin state. The coherent spin state of the coating material in turn aligns the surface electrons of the conducting material (i.e. current carrier electrons) in a spin-polarized state.

Also the so-called "skin effect" has a role in the present invention. The skin effect has an effect on the electrons in a way where they are prone to move on a surface area of the conducting material, instead of the inner parts of the material volume. The polarized electric field of the coating material will polarize the electrons moving near the interface area so that their spins will significantly be mutually aligned with one another. The result is that around the interface between the conductive material and the coating material there moves a coherent group of electrons whose magnetic axes have the same direction for the whole electron group.

Generally speaking, the present invention is applicable to any physical device, situation, phenomenon, or medium, where electric current is able to propagate within the medium.

As proof of the effect of the used coating structures according to the invention, we refer to the following result graphs.

Figure 7:
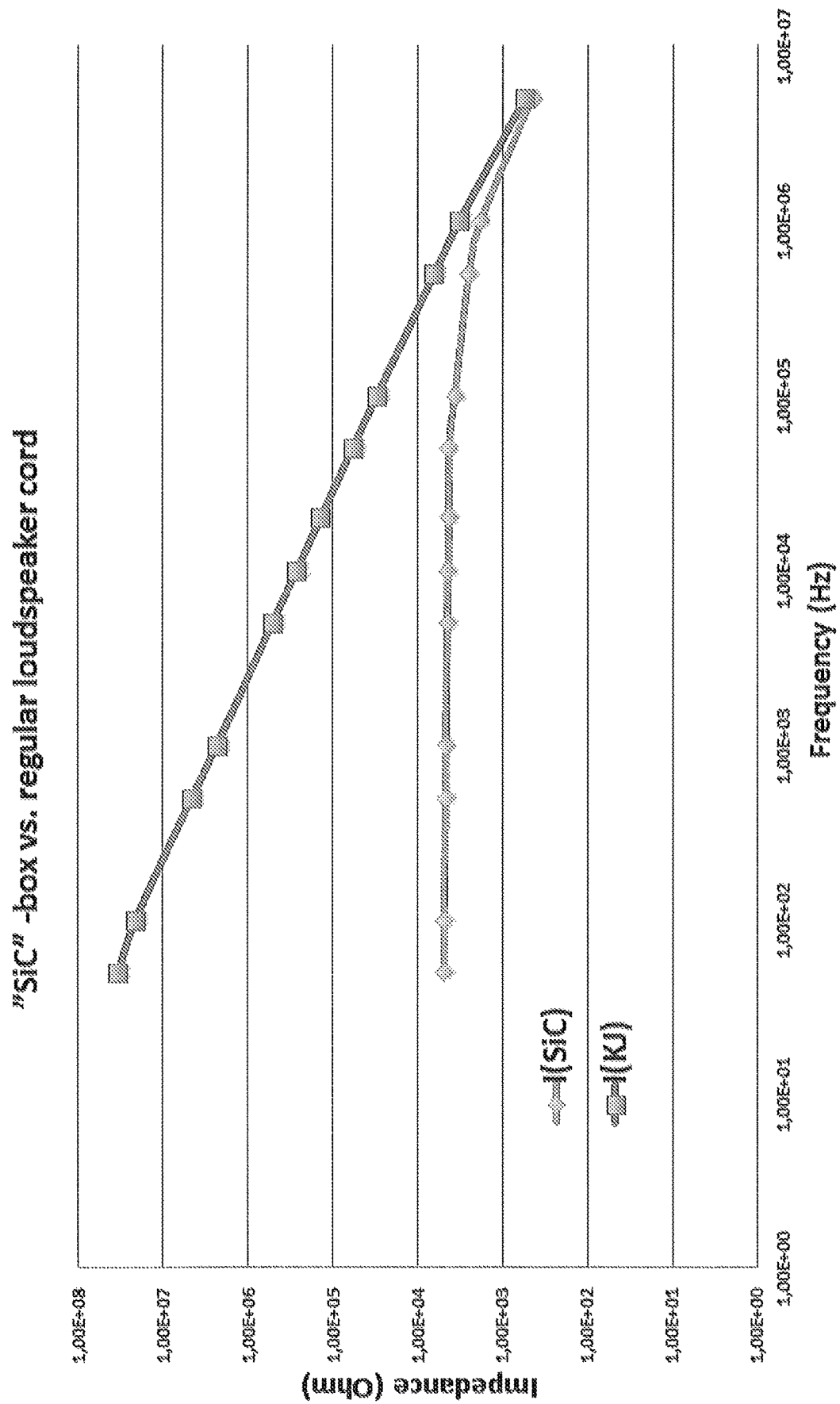
FIG. 7 illustrates an impedance graph as a function of frequency for a regular loudspeaker cord and a spin source with silicon carbide coating.

FIG. 7 illustrates a basic loudspeaker cable (or cord) and a black box according to the principle of FIG. 1 where the coating in the black box is manufactured from silicon carbide (i.e. SiC). The graph shows impedance as a function of frequency for both of those elements. As it can be tangibly seen, the impedance of the regular loudspeaker cable descends linearly as a function of frequency. Instead, with the inventive structure of the SiC coating in the structure of FIG. 1, the impedance is approximately constant for frequencies less than about 70 kHz. For higher frequencies than that, the impedance is asymptotically closing in with the corresponding values of the regular loudspeaker cord.

Figure 8:
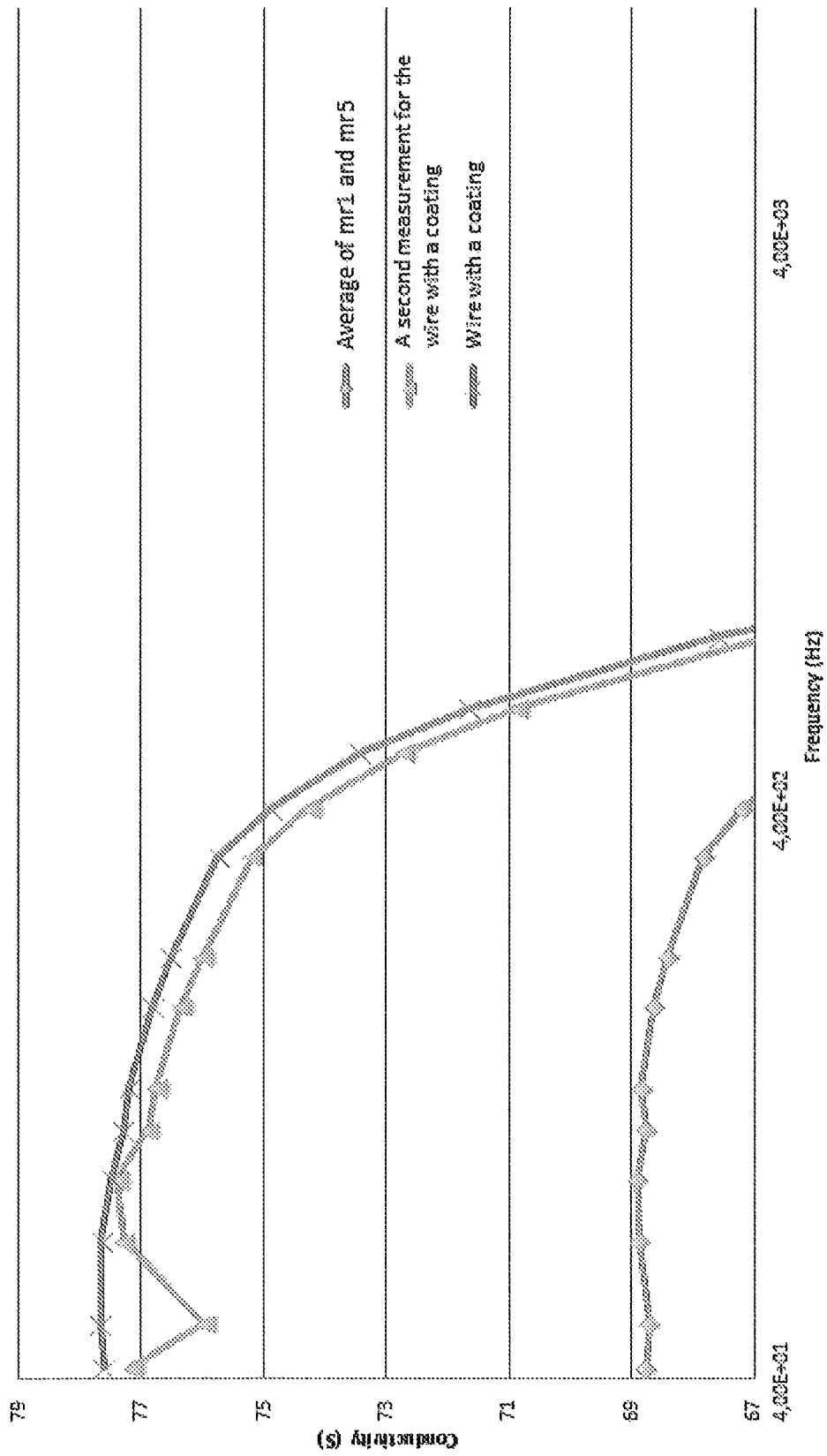
FIG. 8 illustrates the conductivity for a regular copper wire and for a coated copper wire according to the invention.

FIG. 8 illustrates the conductivity of the copper wires whose cross-sectional area is 1.5 square millimeters and length is 1 m. The wire is a multi-thread wire. The conductivity is illustrated as a function of frequency. The lowest graph represents a regular copper wire and its rather low conductivity on a shown frequency range. The uppermost graph illustrates a modified copper wire system where a spin source has been added as an added coated wire. The added coated wire in turn is connected to the regular wire, and the conductivity is measured from the spin-fed regular wire. The power supply feeds the electric current first to the modified wire, and the affected current then passes to the regular copper wire. The conductivity is increased for the modified wire for the shown frequency range. The middle graph shows once more the same modified wire combination as the uppermost graph, but this measurement is performed later in time. Actually the spin source (the coated wire) has been removed, and the second measurement is performed to the regular wire well after the removal. It can be seen that the conductivity remains almost at the same high level than in the first measurement, although the spin source has been already removed. This is a significant result. In practice, the effective period of time when the effect is still seen after the removal of the spin source, can be from several minutes to several weeks. The conductivity will slowly decrease during that time.

Figure 9:
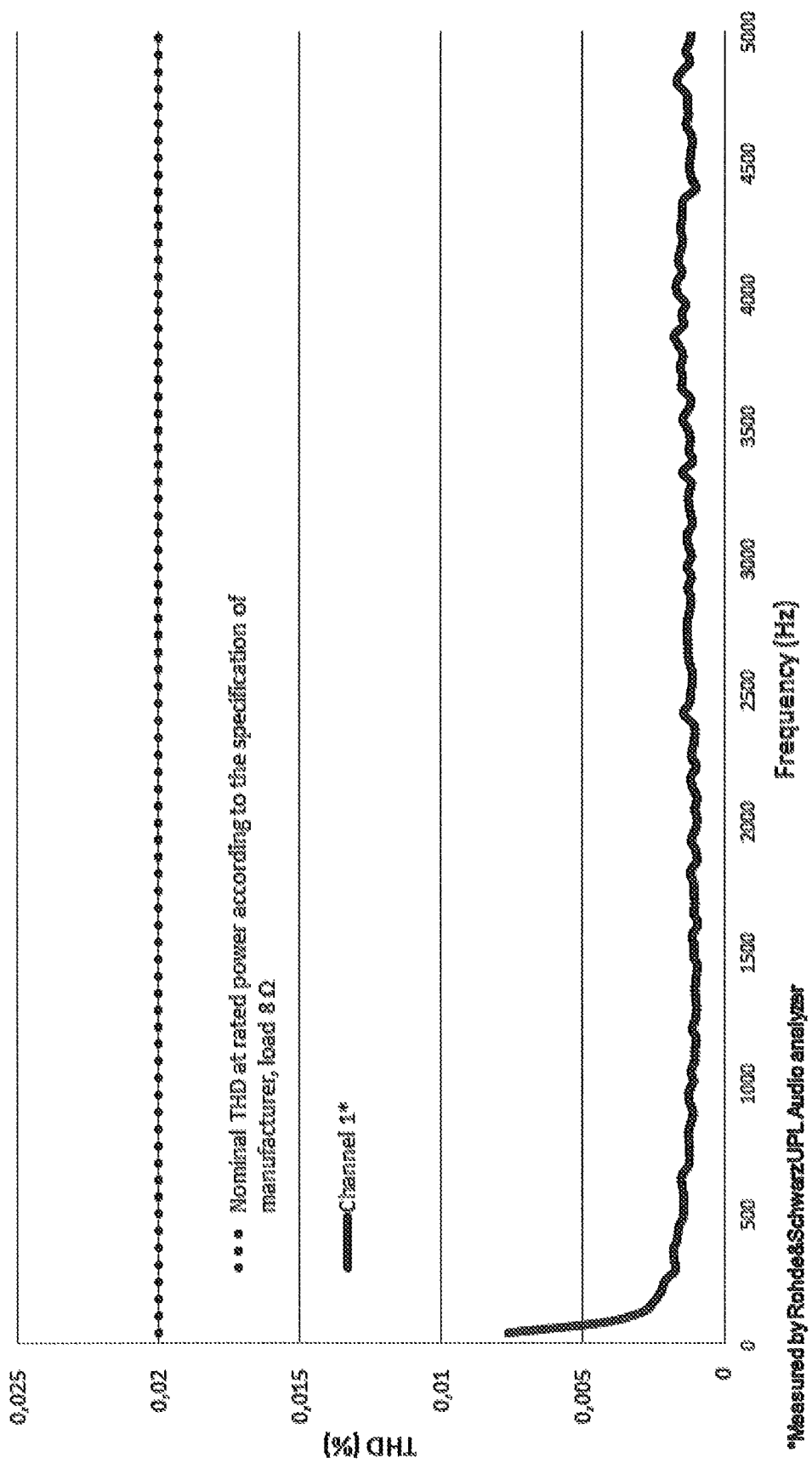
FIG. 9 illustrates a total harmonic distortion (THD) measurement for a moderate 20 W HiFi power amplifier.

FIG. 9 illustrates a total harmonic distortion (THD) measurement for a moderate 20 W HiFi power amplifier. The dot line represents a nominal THD value at rated power according to the specification of the manufacturer, when the load is 8 ohms. The solid line in turn shows the measurement result, when the PA power supply (230 VAC) cord has been provided with a spin source in a form of a coated supply wire. As it can be seen from the Figure, the distortion values are significantly lower than the nominal values provided by the manufacturer's specification.

Figure 10:
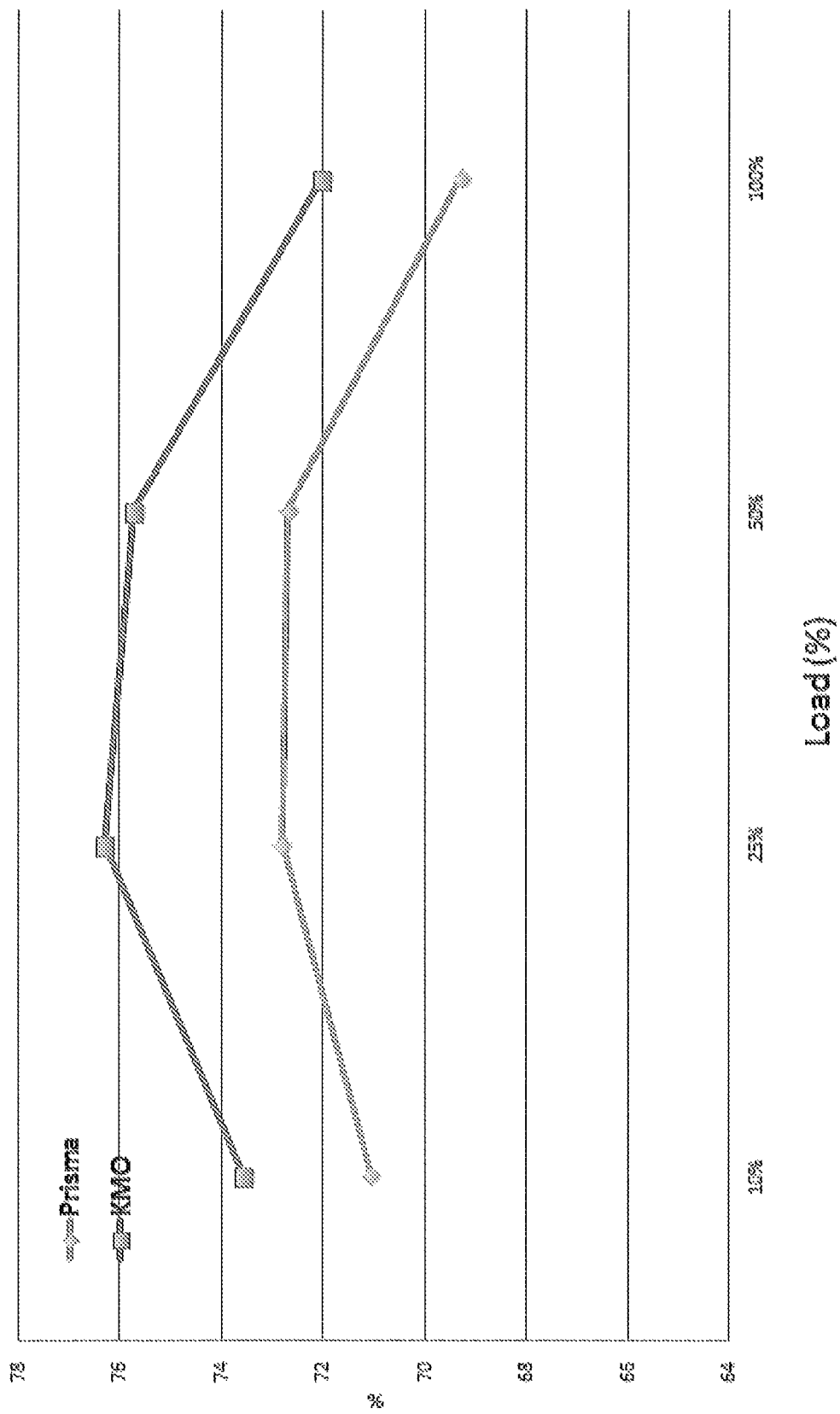
FIG. 10 illustrates measurement results of efficiency of a mobile phone charger "FWHK"

FIG. 10 illustrates measurement results of efficiency of a mobile phone charger manufactured by "FWHK". This charger ACP-12E can be used with Nokia mobile phones. The efficiency is shown in percentages in four different loading levels. The lower graph ("Prisma") illustrates a regular mobile phone charger purchased from a large mall. It can be seen that the efficiency reaches a bit less than 73% at its maximum value (with 25% load). The upper graph illustrates the situation applying the present invention. The mobile phone charger is the same as in "Prisma", but additionally an electric power supply cord of the charger has been connected to a coated wire according to the present invention which acts as a spin source for the charger. The best available efficiency reaches over 76% with the supply wire provided with the spin source. The difference is a clear advantage of the created spin source, i.e. achieved by the coated supply wire.

Figure 11:
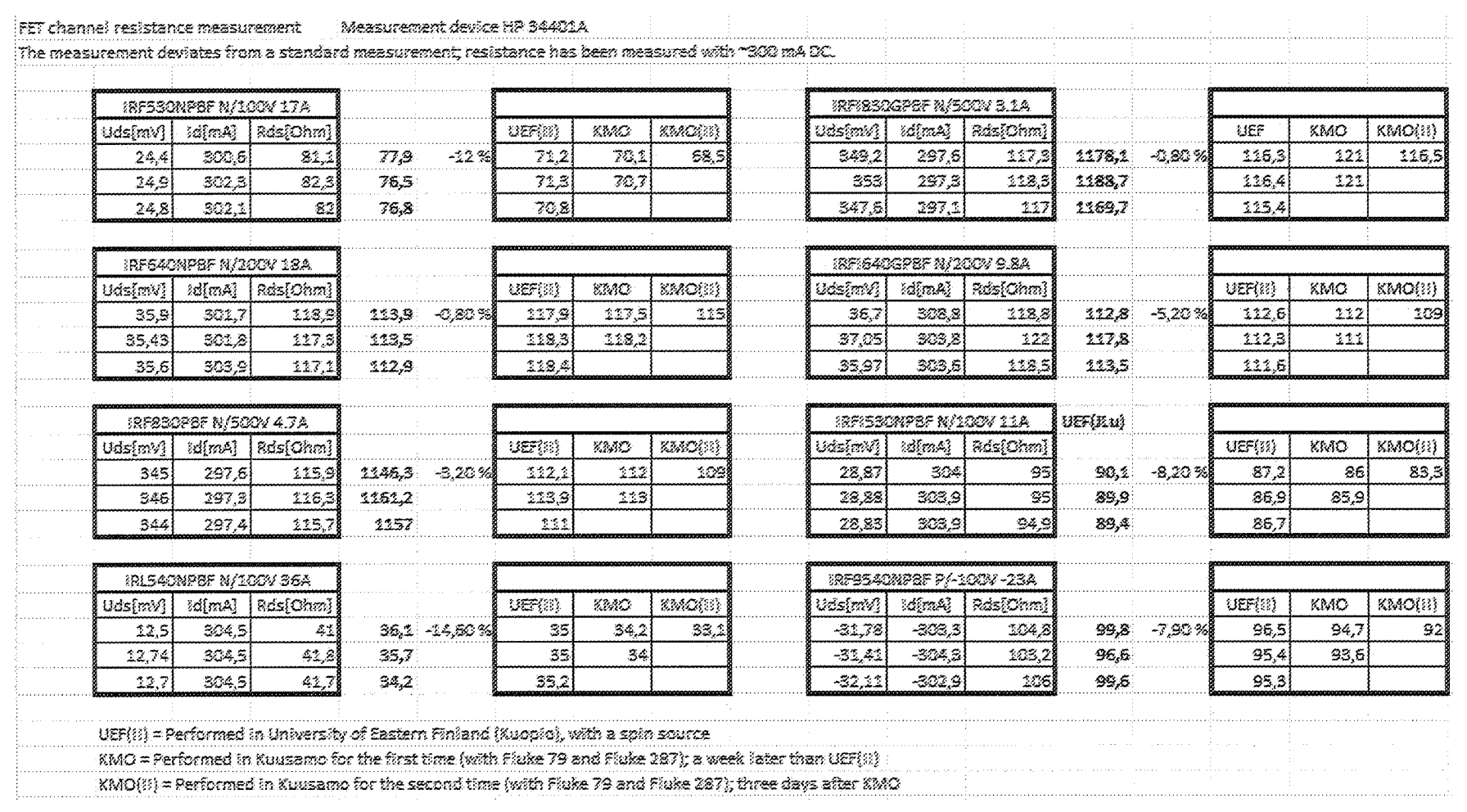

FIG. 11 illustrates measurement results for channel resistances of various field-effect transistors (FETs). Among four larger columns, the first and third columns illustrate various different FETs, whose parameters have been measured directly after they have been received from the component distributor. Each larger column comprises a voltage, a current and a resistance value for the FET, without any spin source connected to the FETs.

In the second and fourth columns, the FETs are provided with a spin source unit according to the invention. The first measurement with the spin source was performed in Kuopio, named as sub-column UEF(II) and showing the channel resistances for each of the FETs, each connected to the spin source in their power supply. One week later, the FETs were transported to Kuusamo in northern Finland, where they were measured again with the spin sources connected in the measurement set-up. The first measurement results of the channel resistances obtained in Kuusamo are located in sub-column KMO, and three days after this, the FETs were once more measured with the same arrangement and these second measurement results from Kuusamo are marked in sub-column KMO(II).

The percentage value in connection with each separate FET (between the first and second columns; and between the third and fourth columns) shows an average decrease of the on-resistance value when comparing the spin-affected FETs to the ones without the spin sources. Depending on the FET, their on-resistance decreases with the spin source but the magnitude of the decrease differs regarding the actual FET. The best result is seen for the lowermost FET in the first and second columns where the resistance decreases by 14.60% for "IRL540NPBF N/100V 36 A" after the spin source has affected the FET. The results show a clear and surprising effect on a parameter value of a FET (channel on-resistance) which has otherwise been considered as constant if the other measurement parameters are fixed (such as when $I_d$=300 mA).

Figure 12:
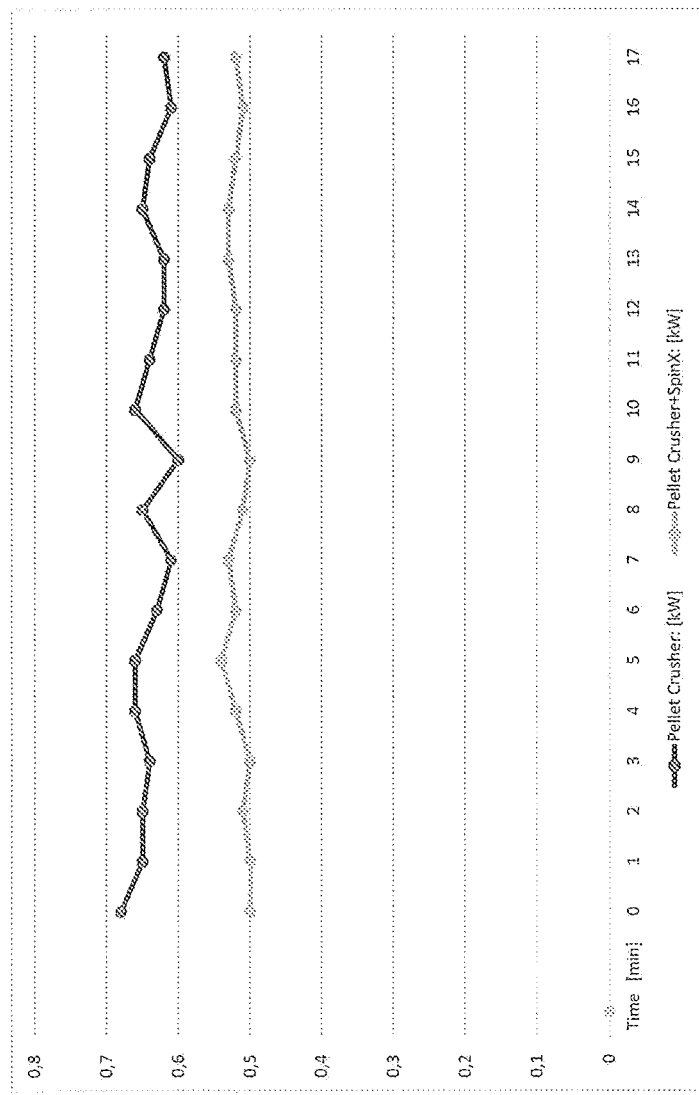
FIG. 12 illustrates power consumption of a pellet crusher line with a regular cable and with a spin-effected cable according to the present invention.

FIG. 12 illustrates power consumption of a pellet crusher line with a regular cable and with a spin-effected cable according to the present invention. This examination has been carried out in the laboratory of the Mining School of Oulu University. In the left-hand side data columns, the power values as a function of time for the normal (regular) power cable feeding the pellet crusher are placed in the left side column in kilowatts. This represents the situation with prior art. On the contrary, the right side column shows power values for a combined cable system, where a regular power cable has been connected to a spin source cable according to the invention. The spin source cable has been named here as "SpinX" cable.

The measured power consumption values are visualized in the graph, showing clearly that in this practical example, power consumption is notably diminished when the SpinX cable is added in the system. The regular cable is shown in the upper curve, while the situation according to the invention is shown in the lower curve. It can also be seen that the situation as a function of time is very stable, in view of the 17 minutes shown in the results. It can be deduced that the spin effect is propagated and maintained for a significantly long time after the spin source cable has been inserted. These long term effects form a significant advantage for the present invention.

Furthermore, the average values of power consumption between the two cable configuration is shown below the data columns. As a finally calculated quantitative result, the decrease in consumed power with a pellet crushing line is about 19%. This is a significant and advantageous result obtained from a real and tangible system of industrial machines.

In yet another example, regarding pulse rising and falling times studied with an oscilloscope, the effect of the present invention is also visible. A step-like inverter driving pulse with $U_{rms}$=12.6 V is fed to the oscilloscope. Without any spin source present, the rising time of the pulse is measured to be 680 ns, and the falling time of the same pulse is determined as 600 ns. The same inverter is then fed to its power supply through a spin source unit or wire. The output pulse with the same $U_{rms}$ is then fed to the oscilloscope, and significantly, the rising time of the pulse is measured to be 520 ns and the falling time of the pulse is 520 ns as well. The rising time has diminished by 23.5% and the falling time by 13.3% when the spin source is applied to the pulse generator. Furthermore, the pulse is fully symmetric, which is an important factor in high speed electronics. These are significant improvements which make all electric circuit delay times shorter, and the operational speeds quicker as well.

All the examples shown in FIGS. 7-12 prove that a significant and surprising effect will happen in electric components, wires and devices when a spin source unit or wire according to the invention is configured between the electric power source or signal source and the actual device, or otherwise connected to the electrical set-up as discussed earlier.

The advantages of the invention are thus various and also significant, and the effect of the invention can be seen in many electrical parameters and characteristics of the electric device affected by the attached spin source. For instance, considering PA systems and generally audio systems and devices, a clear improvement on the sound quality can be observed when using the spin source connected to the PA system or device. The same effect on the sound quality can be obtained and observed by using coated wires according to the invention between the power amplifier and the loudspeaker(s). In television broadcasting applications, the broadcast signal quality is clearly improved regarding contrast and sharpness, when the television signal cable between the antenna connector and the television unit itself is provided with the coating or the layer structure presented above in connection with the invention.

Further advantages of the invention comprise the fact that the rising and falling times of pulse shaped signals are shortened when the spin source unit or wire is applied. Furthermore, the invention is freely applicable in systems applying any operating voltages and frequencies.

A further advantage is that the devices (such as e.g. chargers) will function in a cooler temperature (i.e. they heat up less), resulting in that they can even have an added current without too excessive heating within the charger. In other words, this means higher current tolerance within the device without any security or operability related risk. This also results in the benefit that the charging process will be completed in a shorter loading time. Furthermore, powerful and rapid charging of various batteries gives great future predictions for emerging technologies such as for electrically driven cars and other vehicles. Furthermore, even batteries in the end of their lifetime (with too much discharge) where they are not usually wakeable back into normal operational life, could be waken up with the loading cables according to the present invention.

A general advantage is that the resulting "spin effect" on the applied electric devices also lasts longer within the electric device than just the time when the add-on unit is actually connected to the electric device.

The present invention is not restricted to the embodiments presented above, but the invention may vary within the scope of the claims. The features mentioned in at least any two dependent claims may be combined together in order to form new embodiments, where applicable.

The invention claimed is:

1. An add-on unit which is connectable to a power supply cord or to a signal cord of an electric device, wherein the add-on unit comprises:
   an electrically conductive material; and
   a coating on at least one surface of the electrically conductive material or on a part of that surface, where the coating comprises ferroelectric and/or piezoelectric and/or pyroelectric material which has a non-centrosymmetric crystal structure resulting in a creation of polarizing effect within at least one of the electrically conductive material and the coating when affected to an electric field occurring when the add-on unit is connected to the power supply cord or to the signal cord of the electric device.

2. The add-on unit according to claim 1, wherein when the add-on unit is connected electrically between an electric power supply or a signal supply cord, and the electric device, the add-on unit acts as a spin source unit feeding spin-polarized current to the electric device.

3. The add-on unit according to claim 1, wherein the add-on unit is connected in parallel with a power supply cord or a signal supply cord of the electric device.

4. The add-on unit according to claim 1, wherein the add-on unit is connected in a shunt connection in a power or signal input of the electric device.

5. The add-on unit according to claim 1, wherein the material with piezoelectric characteristics is silicon carbide or silicon dioxide.

6. The add-on unit according to claim 1, wherein the coating comprises material which is configured to experience a poling effect when affected to an electric field.

7. The add-on unit according to claim 1, wherein the electrically conductive material is manufactured from at least one of the following materials: copper, aluminium, carbon, iron, nickel, metal alloys, at least partly semiconducting material such as silicon, graphite, graphene or some other allotropic form of carbon.

8. The add-on unit according to claim 1, wherein the coating is made of PZT, $BiFeO_3$, $BaTiO_3$, Rochelle salt, zinc oxide, zinc sulfide, aluminium nitride, bismuth germanate, or of a desired combination of at least two of these substances.

9. The add-on unit according to claim 1, wherein the coating is manufactured from a mixture of a piezoelectric material and a diamagnetic material.

10. The add-on unit according to claim 1, wherein the coating is manufactured as a composite coating with at least two different layers.

11. The add-on unit according to claim 1, wherein the coating is manufactured as a mixture comprising at least two different substances which are mixed to form a homogenous coating.

12. The add-on unit according to claim 1, wherein the coating is further coated with an insulating layer.

13. The add-on unit according to claim 1, wherein two add-on units are integrated together via an insulating region in an AC application.

14. The add-on unit according to claim 1, wherein the add-on unit has a form of a rectangular parallelepiped with the input and output cords connected in opposite ends of a longitudinally shaped add-on unit.

15. The add-on unit according to claim 1, wherein the add-on unit has a form of a coated wire or it is formed as a group of coated threads forming a cable.

16. The add-on unit according to claim 1, wherein the thickness D of the coating is selected between 10 nm<D<0.5 mm.

17. The add-on unit according to claim 1, wherein the length L of the coated conductive material is selected between 0.5 m<L<2 m.

18. The add-on unit according to claim 1, wherein the coating is a composite layer structure or a mixture of at least two substances where a polymer acts as a binder and at least one piezoelectric material act as an active ingredient, wherein the mass of the polymer is selected between 10-60% from the total mass of the coating and the mass of the at least one piezoelectric material is selected between 40-90%, respectively.

19. The add-on unit according to claim 1, wherein the add-on unit comprises a stacked group of several coated sheets, disks or coils where insulating layers are placed between different active layers.

20. The add-on unit according to claim 1, wherein the coating is configured to be manufactured by Chemical Vapour Deposition, Physical Vapour Deposition, Pulsed Laser Deposition; or by depositing the material by spraying, spreading with a brush or dipping in a paste, and drying or heat treating the deposited material in a separate process stage.

21. A method of creating and feeding spin-polarized electric current to an electric device by an add-on unit, wherein the method comprises the steps of:
   manufacturing an add-on unit by coating an electrically conductive material with a coating concerning at least a part of a surface of the electrically conductive material, where the coating comprises ferroelectric and/or piezoelectric and/or pyroelectric material which has a non-centrosymmetric crystal structure resulting in a creation of polarizing effect within at least one of the electrically conductive material and the coating when affected to an electric field occurring when the add-on unit is connected to the power supply cord or to the signal cord of the electric device; and connecting the add-on unit electrically to a signal input cord or to a power supply cord of the electric device in order to create and feed spin-polarized electric current to the electric device.

* * * * *